April 7, 1970 D. N. GERSHBERG 3,505,589
VERY HIGH FREQUENCY LIMITER
Filed Jan. 26, 1968
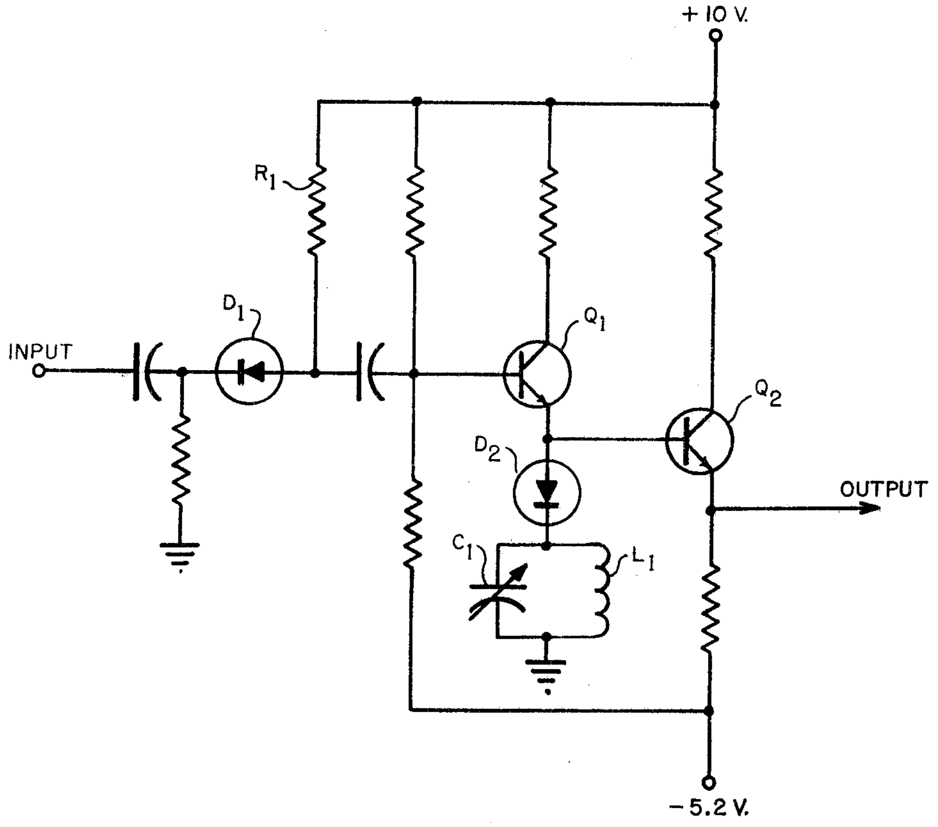
INVENTOR,
DAVID N. GERSHBERG.
BY
Harry M. Saragovitz, Edward J. Kelly, Herbert Berl & Julian C. Keppler
ATTORNEYS.

United States Patent Office 3,505,589
Patented Apr. 7, 1970

3,505,589

VERY HIGH FREQUENCY LIMITER

David N. Gershberg, Rockville, Md., assignor, by mesne assignments, to the United States of America as represented by the Secretary of the Army Filed Jan. 26, 1968, Ser. No. 701,005
Int. Cl. G05f *3/00*
U.S. Cl. 323—9 4 Claims

ABSTRACT OF THE DISCLOSURE

A VHF, low level limiter having a minority carrier storage diode between an input signal and the base of a transistor and having a parallel resonant circuit connected to the emitter and to ground.

BACKGROUND OF INVENTION

The present invention relates generally to limiters and more particularly to very high frequency (VHF) limiters which are capable of acting on low voltage level signals.

In the field of limiters, it has been the general practice to employ back to back shunt diodes, transistor limiters and back to back varactors. The back to back diode limiters and the transistor limiters do not have the desired hard limiting characteristics of the invention. The varactor diode limiters are well suited for large RF levels, but do not have the hard limiting characteristics of the invention, and have the additional drawback that parametrically excited subharmonic oscillations are likely to occur at certain power levels.

SUMMARY OF INVENTION

The general purpose of the invention is to provide a limiter which embraces all the advantages of similarly employed devices and possesses none of the disadvantages. The employment of minority carrier storage effects and junction capacitance characteristics of solid state junctions are utilized to provide a VHF limiter which is capable of operating at low RF levels, and has a very high speed response over a greater input dynamic range than heretofore obtainable. With the present circuit, limiting range is easily extended by connecting several limiters in series and output signals have very little distortion since limiting is not due to clipping.

DESCRIPTION OF DRAWING

The exact nature of this invention will be readily apparent from consideration of the following specification relating to the annexed drawing in which:

The single figure shows a schematic view of the circuit of a preferred embodiment of the invention.

DESCRIPTION OF PREFERRED EMBODIMENT

Referring now to the drawing, there is shown in the single figure a minority carrier storage diode $D_1$ which is forward biased from a +10 volt source via resistor $R_1$. The amount of forward bias is chosen such that sufficient minority carriers are stored at the highest input level expected, to allow the diode to conduct over the positive half-cycle of the VHF wave without exhibiting the normal abrupt change from conduction to cutoff during the nonconduction half cycle. Since the diode is forward biased its series resistance is low compared to the input impedance of $Q_1$ thus there is a negligible loss of power transfer from the input through $D_1$ to $Q_1$. However, as the input wave increases in amplitude the orientation of $D_1$ is such that the self-bias developed at the anode opposes the static forward bias thus increasing the series impedance of $D_1$. Therefore as the input power increases, the loss across $D_1$ increases and the power transferred to $Q_1$ tends to remain constant.

Transistor $Q_1$ and its associated emitter circuitry act as a second stage limiter to further enhance the limiting characteristics. The extrinsic emitter inductance of $Q_1$, is series resonated slightly below the lowest frequency of interest with $C_1$ and the combined junction capacitance of $Q_1$ and $D_2$. $L_1$ provides a DC return to ground and is tuned to parallel resonance with $C_1$ below the frequency of interest, thus appearing net capacitive at the junction of $L_1$, $D_2$. As the RF level increases at the base of $Q_1$ the reactive component of $Q_1$, $D_2$ decreases lowering the series resonant frequency of the overall network. This has the effect of maintaining the voltage output of $Q_1$ constant as the impedance of the series resonant circuit lowers with increasing base drive to $Q_1$.

Transistor $Q_2$ is connected as an emitter follower to provide a low output impedance and to buffer the reactive network of $Q_1$ from the load.

Some typical values of the circuit as built are:

$R_1$=5.6K
$C_1$=2–8 pf.
$L_1$=.15 μh.
$D_1$ and $D_2$=1N4152

What is claimed is:

1. A very high frequency limiter circuit comprising:
an input for receiving low level, very high frequency voltage signals;
a minority carrier storage device having 1st and 2nd terminals, said 1st terminal connected to said input;
a transistor having base, emitter and collector electrodes, said base electrode connected to the second terminal of the minority carrier storage device;
a bias voltage source connected to said second terminal of the carrier storage device and to the collector of said transistor;
a diode having a 1st and a second terminal, said 1st terminal connected to the emitter of said transistor;
a parallel resonant circuit having a first and second terminal, said 1st terminal connected to the 2nd terminal of the diode and said second terminal connect to ground; and
an output connected to the emitter of the transistor.

2. The circuit of claim 1 in which said minority carrier storage device is a diode.

3. The circuit of claim 2 further including: a second transistor connected to the output as an emitter follower to provide a low output impedance.

4. A circuit comprising:
a transistor having a base, emitter and collector;
a bias voltage source connected to said collector;
a first limiter consisting of a minority carrier diode connected to said base; and
a second limiter connected to said emitter.

References Cited

UNITED STATES PATENTS

| | | | |
|---|---|---|---|
| 3,163,826 | 12/1964 | Kemper | 307—237 X |
| 3,328,705 | 6/1967 | Eubanks | 307—237 X |

LEE T. HIX, Primary Examiner

A. D. PELLINEN, Assistant Examiner

U.S. Cl. X.R.

307—300, 319